United States Patent
Gu et al.

(10) Patent No.: US 11,776,871 B2
(45) Date of Patent: Oct. 3, 2023

(54) MODULE WITH SUBSTRATE RECESS FOR CONDUCTIVE-BONDING COMPONENT

(71) Applicant: SEMICONDUCTOR COMPONENTS INDUSTRIES, LLC, Phoenix, AZ (US)

(72) Inventors: Leo Gu, Suzhou (CN); Sixin Ji, NanTong (CN); Jie Chang, Suzhou (CN); Keunhyuk Lee, Suzhou (CN); Yong Liu, Cumberland Foreside, ME (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 99 days.

(21) Appl. No.: 17/247,525

(22) Filed: Dec. 15, 2020

(65) Prior Publication Data

US 2022/0189848 A1 Jun. 16, 2022

(51) Int. Cl.
*H01L 23/373* (2006.01)
*H01L 23/00* (2006.01)
*H01L 21/48* (2006.01)

(52) U.S. Cl.
CPC ...... *H01L 23/3735* (2013.01); *H01L 21/4871* (2013.01); *H01L 24/32* (2013.01); *H01L 24/83* (2013.01); *H01L 2224/32237* (2013.01); *H01L 2224/83815* (2013.01)

(58) Field of Classification Search
None
See application file for complete search history.

(56) References Cited

U.S. PATENT DOCUMENTS

| | | | |
|---|---|---|---|
| 7,759,778 B2 | 7/2010 | Lowry et al. | |
| 7,786,486 B2 | 8/2010 | Casey et al. | |
| 9,390,996 B2 | 7/2016 | Jeon | |
| 2010/0252312 A1* | 10/2010 | Wolde-Giorgis | B23K 35/025 228/256 |
| 2013/0328204 A1 | 12/2013 | Zommer | |
| 2018/0197833 A1* | 7/2018 | Sakakibara | H01L 24/32 |
| 2019/0013261 A1* | 1/2019 | Shiizaki | H01L 23/49582 |
| 2020/0185310 A1* | 6/2020 | Cho | H01L 23/49833 |
| 2020/0251423 A1* | 8/2020 | Yabuta | H01L 25/07 |

FOREIGN PATENT DOCUMENTS

WO   WO-2022096226 A2 * 5/2022

* cited by examiner

*Primary Examiner* — Robert K Carpenter
(74) *Attorney, Agent, or Firm* — Brake Hughes Bellermann LLP

(57) ABSTRACT

In one general aspect, an apparatus can include a semiconductor component, a substrate including a recess, and a conductive-bonding component. The conductive-bonding component is disposed between the semiconductor component and the substrate. The conductive-bonding component has a first thickness between a bottom of the recess and a bottom surface of the semiconductor component greater than a second thickness between the top of the substrate and the bottom surface of the semiconductor component.

19 Claims, 4 Drawing Sheets

MODULE WITH SUBSTRATE RECESS FOR CONDUCTIVE-BONDING COMPONENT

TECHNICAL FIELD

This description generally relates to a recess within a substrate for a conductive-bonding component.

BACKGROUND

Within a high-power module, spacers can be coupled to semiconductor die and can be used to facilitate cooling. However, spacers made of materials that are reliable can be relatively expensive and can be the most expensive components in some high-power modules. Some cheaper spacer materials, while desirable to use from a cost perspective, may not be desirable to use in certain components because they may not be reliable.

SUMMARY

In one general aspect, an apparatus can include a semiconductor component, a substrate including a recess, and a conductive-bonding component. The conductive-bonding component is disposed between the semiconductor component and the substrate. The conductive-bonding component has a first thickness between a bottom of the recess and a bottom surface of the semiconductor component greater than a second thickness between the top of the substrate and the bottom surface of the semiconductor component.

The details of one or more implementations are set forth in the accompanying drawings and the description below. Other features will be apparent from the description and drawings, and from the claims.

DETAILED DESCRIPTION

A high-power module can include a stack including a spacer coupled to a semiconductor die, and the spacer can be coupled to the substrate via a conductive-bonding component such as a solder. The spacer can function as a thermal spreader within the high-power module. The substrate, which can be a direct-bonded metal (e.g., DBM (e.g., direct bonded copper)) substrate, can include one or more recesses (e.g., dents) to which the conductive-bonding component can be coupled. The one or more recesses, which can be part of or included in one or more channels, can be used to allow for an increase in the thickness of the conductive-bonding component (e.g., solder) in some locations around the substrate so that bonding of the spacer to the substrate is more reliable. Specifically, the relatively thick conductive-bonding component can result in increased thermal shock lifetime of the high-power module.

The configurations described herein can allow for use of a relatively cheap spacer material such aluminum (Al) (e.g., Al spacer with copper (Cu) plating). The spacer materials can be used to replace spacer materials such as copper molybdenum (CuMo). The use of a cheaper spacer material can significantly decrease the overall cost of a high-power module.

In some implementations, the use of an Al spacer can also result in the high-power modules being lighter (e.g., lighter from a weight perspective). Also, in some implementations, the low modulus characteristics of an Al spacer combined with the relatively thick portions of a conductive-bonding component within recess(es) defined within a substrate can contribute to higher reliability of (e.g., increased thermal shock lifetime) power modules.

High-power modules, such as those described herein can be used in a variety of applications such as automotive applications (e.g., main traction inverter in a hybrid electric vehicle or electric vehicle after the battery). In some implementations, the high-power modules can be dual-side cooling modules.

Figure 1A:
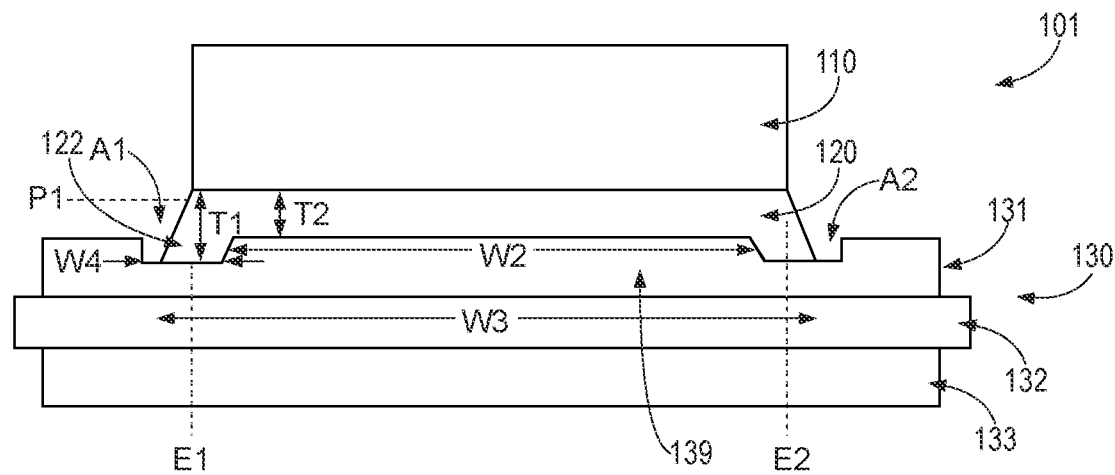
FIG. 1A illustrates a portion of a power module including a semiconductor component coupled to a substrate via a conductive-bonding component.

FIG. 1A illustrates a portion 101 of a power module including a semiconductor component 110 coupled to a substrate 130 via a conductive-bonding component 120. As shown in FIG. 1A, a portion 122 of the conductive-bonding component 120 is disposed within a recess A1, and a portion 124 of the conductive-bonding component is disposed between a top surface of the substrate 130 and a bottom surface of the semiconductor component 110.

As shown in FIG. 1A, the substrate 130 is a DBM (e.g., a direct bonded copper) substrate. As a DBM, the substrate 130 includes a dielectric 132 (e.g., a dielectric layer) disposed between two metal layers—a metal layer 131 and a metal layer 133. In some implementations, dielectric 132 can be alumina ceramic. In some implementations, one or more of the metal layers 131, 133 can be a copper material or alloy.

As shown in FIG. 1A, the recess A1 is formed within the metal layer 131 of the substrate 130. Accordingly, as shown in FIG. 1A, the portion 122 of the conductive-bonding component 120 is disposed within the recess A1 formed within the metal layer 131 of the substrate 130. Also, the portion 124 of the conductive-bonding component is disposed between a top surface of the metal layer 131 of the substrate 130 and a bottom surface of the semiconductor component 110.

The portion 122 of the conductive-bonding component 120 has a thickness T1 greater than the thickness T2 of the portion 124 of the conductive-bonding component 120. The thickness T1 of the portion 122 is greater because the portion 122 of the conductive-bonding component 120 is disposed within the recess A1 within the metal layer 131 substrate 130. The thickness T1 extends between the bottom surface of the recess A1 and a bottom surface of the semiconductor component 110. The thickness T2 extends between the top surface of the substrate 130 (metal layer 131) and the bottom surface of the semiconductor component 110.

The increased thickness T1 (relative to the thickness T2 of portion 124) can result in bonding of the semiconductor component 110 (at least around the edges of the semiconductor components 110) to the substrate 130 that is more reliable. Specifically, the relatively thick portion 122 of the conductive-bonding component 120 can result in increased thermal shock lifetime of the portion 101 of the power module.

In some implementations, the thickness T1 can be double the thickness T2. In some implementations, the thicknesses T1 and/or T2 can be order of hundreds of microns. For example, the thickness T1 can be 400 μm and the thickness T2 can be 200 μm. In some implementations, the thickness T1 can be less than double the thickness T2 or greater than double the thickness T2. Although not labeled, the depth of the recess A1, can be equal to the difference between thickness T1 and thickness T2.

As shown in FIG. 1A, the recess A1 is disposed directly below an edge E1 of the semiconductor component 110. In other words, a projection of the edge E1 of the semiconductor component 110 intersects recess A1. In some implementations, the edge E1 of the semiconductor component 110 is disposed directly over (e.g., is vertically disposed over) the recess A1.

In some implementations, the edge E1 of the semiconductor component 110 is disposed approximately within a midpoint of a width W4 (e.g., lateral width aligned along the substrate 130) of the recess A1. In some implementations, the width W4 of the recess A1 is greater than (e.g., more than 2 times greater than) the thickness T1. In some implementations, the width W4 of the recess A1 is greater than (e.g., more than 2 times greater than) the thickness T2. In some implementations, width W4 of the recess A1 can be hundreds of microns. In some implementations, the width W4 of the recess A1 can be, for example, 1500 μm.

In this view, the horizontal or lateral direction can be along a plane aligned along the substrate 130, and the vertical direction can be a direction that is orthogonal to a plane aligned along the substrate 130. The widths are aligned along the horizontal or lateral direction, and the thicknesses are aligned along the vertical direction.

Figure 1B:
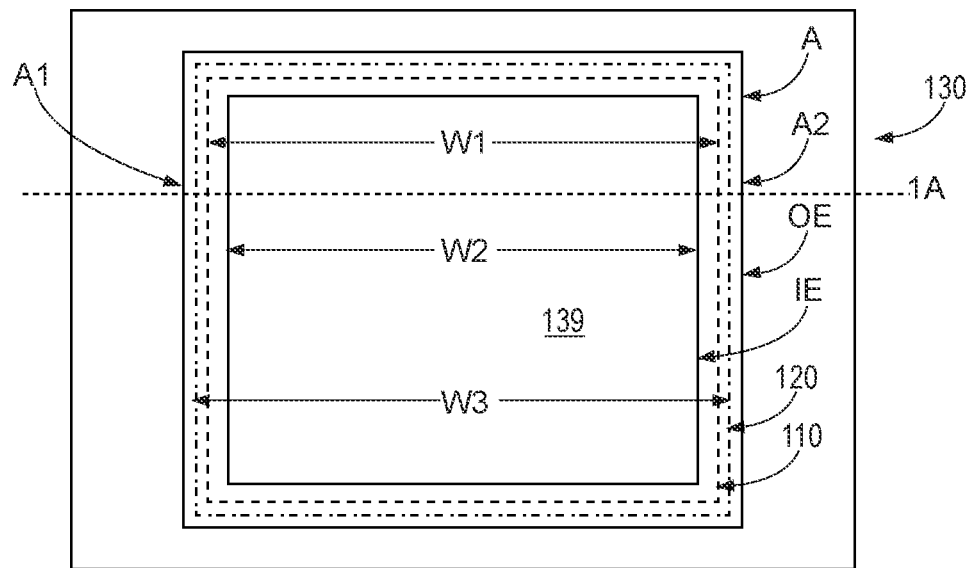
FIG. 1B is a diagram that illustrates a top view of some portions of the portion of the power module shown in FIG. 1A.

As shown in FIG. 1A, the conductive-bonding component 120 also has a portion disposed in a recess A2. Accordingly, the conductive-bonding component 120 can have the 122 on one side that is disposed in the recess A1 and a portion on the opposite side that is disposed in the recess A2. The recess A1 and the recess A2 can be part of or included in the same channel (e.g., can be part of or included in a common channel) that is disposed around (e.g., entirely around, surrounding) the semiconductor component 110. The channel A around the semiconductor component 110 is illustrated in FIG. 1B, and FIG. 1A is a cross section along line 1A shown in FIG. 1B. In some implementations, the recess A1 and/or A2 can have a flat (e.g., substantially flat) bottom surface aligned with a plane aligned along a bottom surface of the semiconductor component 110 and/or the substrate 130.

FIG. 1B is a diagram that illustrates a top view of some portions of the portion 101 of the power module shown in FIG. 1A. As shown in FIG. 1B, an outline of the semiconductor component 110 is illustrated with a dashed line. Also, an outline of the conductive-bonding component 120 is illustrated by a dot-dashed line. As shown in FIG. 1B, a channel A has an inner edge IE and an outer edge OE and recesses A1 and A2 are part of (or define parts of) the channel A. The channel A has four sides (e.g., side lengths, side portions)—two horizontally-oriented sides and vertically-oriented sides as shown in FIG. 1B—that define a square or rectangular shape.

The outer perimeter of the semiconductor component 110 is disposed over the channel A. In other words, the outer perimeter of the semiconductor component 110 (as projected from above) is disposed within the inner edge IE and the outer edge OE of the channel A. Also, in this implementation, the outer perimeter of the conductive-bonding component 120 (as projected from above) is disposed between the inner edge IE and the outer edge OE of the channel A. The outer perimeter of the conductive-bonding component 120 (as projected from above) is disposed outside of the outer perimeter of the semiconductor component 110. The edges E1 and E2 (shown in FIG. 1A) of the semiconductor component 110 are disposed within a vertical location between the inner edge IE and the outer edge OE of the channel A. In some implementations, the channel A can be referred to as a channel around the perimeter of the semiconductor component 110 or as a perimeter channel.

The inner edge IE of the channel A defines a mesa 139 (also can be referred to as an island) having a width W2. In other words, the channel A defines a mesa 139 within the metal layer 131 of the substrate 130. The thickness of the mesa 139 is equal to the difference between thickness T1 and thickness T2. In some implementations, the channel A only partially surround the semiconductor component 110. The semiconductor component 110 has a width W1 greater than a width W2 between the inner edge IE of the first recess portion A1 and the inner edge IE of the second recess portion A2.

The width W2 is smaller than the width W1 of the semiconductor component 110. Accordingly, the width W2 of the mesa 139 is smaller than the width W1 semiconductor component 110. The width W2 of the mesa 139 is smaller than the width W3 of the conductive-bonding component 120. Also, the width W1 of the semiconductor component 110 is less than the width W3 of the conductive-bonding component 120. These widths are also illustrated in FIG. 1A.

In some implementations, the semiconductor component 110 can include a semiconductor die. In some implementations, the semiconductor component 110 can include a spacer (e.g., a spacer material). In such implementations, the spacer can be coupled to the conductive-bonding component 120. In some implementations, the semiconductor component 110 can include a combination of a semiconductor die and a spacer. More details related to such an arrange is shown and described in connection with at least FIG. 6.

In some implementations, one or more channels can have a different shape than shown in FIG. 1B. In other words, the width of one or more sides of the channel may not be consistent (e.g., may not be constant). For example, a side can have a width that varies along the length of the side (e.g., narrower toward or at a corner of the channel and wider in a middle portion of a side length of the channel, or vice versa).

Figure 2:
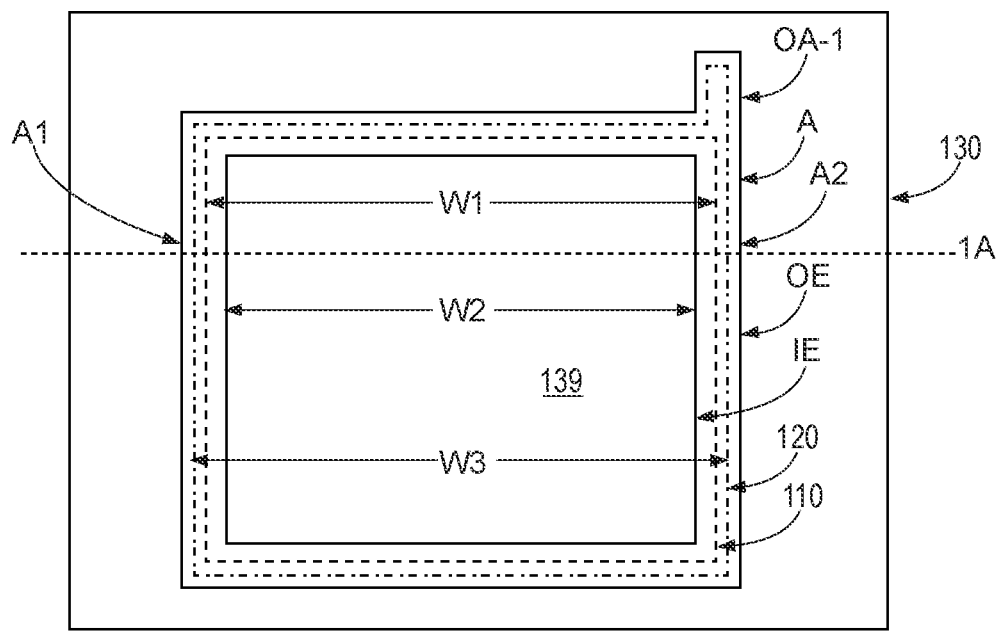
FIG. 2 is a diagram that illustrates a variation of the channel shown FIG. 1B.

FIG. 2 is a diagram that illustrates a variation of the channel A shown FIG. 1B. As shown FIG. 2, the channel A has an overflow portion OA-1 that extends from the channel A. Accordingly, the overflow portion OA-1 is in fluid communication with the channel A.

The conductive-bonding component 120 has a portion that is disposed in the overflow portion OA-1 of the channel A. In some implementations, the conductive-bonding component 120 (e.g., a solder) can have a portion that flows into the overflow portion OA-1 of the channel A during coupling of the semiconductor component 110 with the substrate 130 via the conductive-bonding component 120. The flow of the conductive-bonding component 120 can occur during a reflow process and/or heating process.

As shown in FIG. 2, the overflow portion OA-1 is aligned along a side of the channel A. The overflow portion OA-1 is aligned along a longitudinal line along a side of the channel A associated with recess A2. The overflow portion OA-1 is an extension of a side of the channel A.

Figure 3:
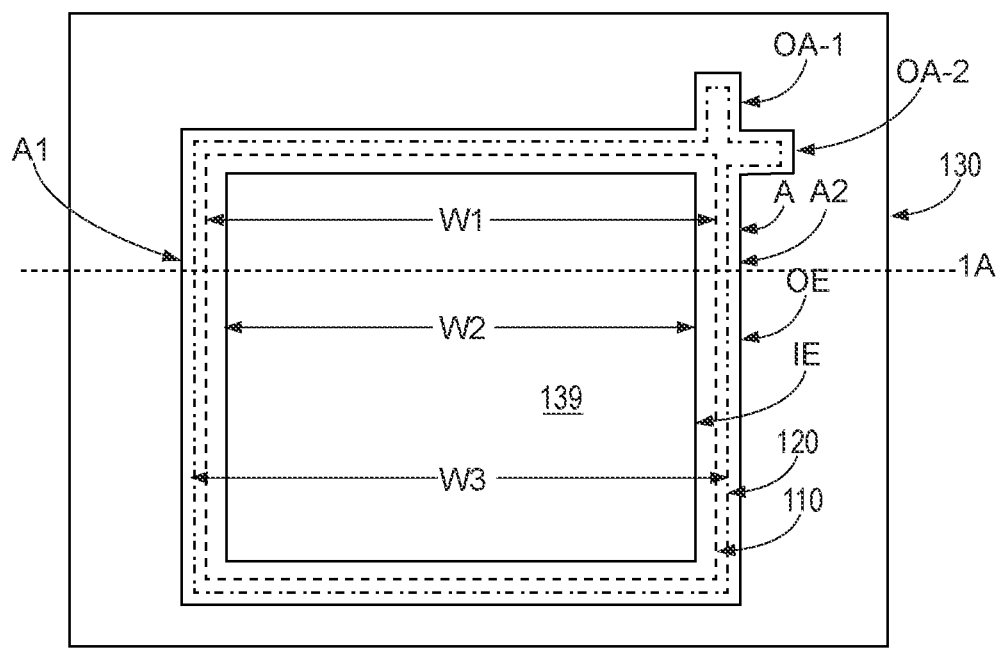
FIG. 3 is a diagram that illustrates a variation of the channel shown FIG. 1B.

FIG. 3 is a diagram that illustrates a variation of the channel A shown FIG. 1B. As shown FIG. 3, the channel A has multiple overflow portions OA-1 and OA-2 that extend from the channel A. As shown in FIG. 2, the overflow portion OA-1 is aligned along a first side of the channel A and the overflow portion OA-2 is aligned along a second side of the channel A. The first and second sides of the channel A can be aligned along orthogonal directions. Accordingly, the overflow portions OA-1, OA-2 are aligned along orthogonal directions. In other words, the overflow portions OA-1, OA-2 are a pair of orthogonally-oriented overflow channels.

Although not shown in FIG. 3, in some implementations, each of the corners defined by the channel A can have one or more overflow portions. In some implementations, an overflow channel may not extend from a corner (e.g., extend from a side) of the channel A. In some implementations, one or more overflow portions can extend from the channel A (e.g., extend from corners of the channel A) along a direction that is not aligned with (e.g., at an angle from) one or more of the sides of the channel A.

In some implementations, overflow portions associated with a channel can have different shapes. For example, an overflow portion can have a semicircular shape or a circular shape (when viewed from above) that is at a corner of two sides of a channel or disposed along a side (e.g., side length or portion) of a channel. As another example, an overflow portion can have a square or rectangular shape (when viewed from above) that is at a corner of two sides of a channel or disposed along a side of a channel.

The recesses A1, A2 shown in FIG. 1A can have a variety of cross-sectional shapes. Accordingly, the channel A can have a variety of cross-sectional shapes. FIGS. 4A through 4D illustrate cross-sectional shapes that can be used in some implementations. The features of the cross-sectional shapes shown in FIGS. 4A through 4D can be combined and/or interchanged.

Figure 4A:
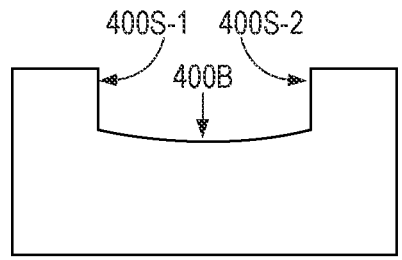
FIGS. 4A through 4D illustrate a variety of cross-sectional shapes of a recess or channel.

FIG. 4A is a diagram that illustrates a u-shaped cross-sectional recess. As shown in FIG. 4A, the recess has straight sidewalls 400S-1 and 400S-2 and a bottom surface 400B that is curved. The concave curved bottom surface 400B shown in FIG. 4A can be replaced with a convex curved bottom surface in some implementations. In some implementations, one or more of the sidewalls 400S-1, 400S-2 can have a curved shape, a sloped surface (e.g., sloped shape), and/or so forth. In some implementations, the bottom surface 400B can have a flat (e.g., substantially flat) shape.

Figure 4B:
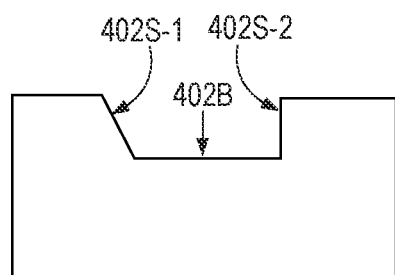

FIG. 4B is a diagram that illustrates a ladder-shaped cross-sectional recess. The ladder-shaped cross-sectional recess is also illustrated in FIG. 1A. As shown in FIG. 4B, the recess has a sloped (e.g., slanted) sidewall 402S-1 and a straight sidewall 402S-2. In some implementations, the sloped sidewall 402S-1 can be an inner sidewall or an outer sidewall. In some implementations, the straight sidewall 402S-2 can be an inner sidewall or an outer sidewall. The bottom surface 402B has a flat (e.g., substantially flat) shape. In some implementations, the recess has a bottom surface 402B that is curved (e.g., convex, concave).

Figure 4C:
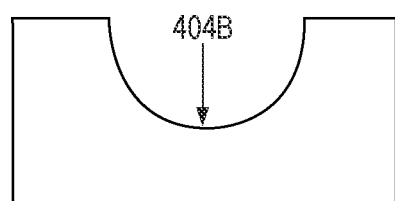

FIG. 4C is a diagram that illustrates a recess with a semi-circular cross-sectional shape 404B. In some implementations, the semi-circular cross-sectional shape 404B can be modified with a different shaped curve (e.g., a curve that has one or more ripples or dimples).

Figure 4D:
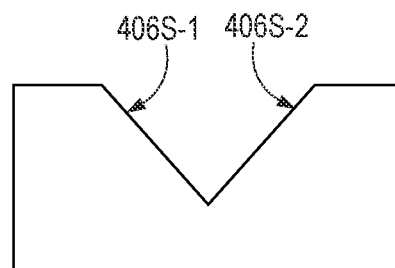

FIG. 4D is a diagram that illustrates a v-shaped cross-sectional shape. The recess has a two sloped sidewalls 406S-1 and 406S-2 that formed a v-shaped cross-sectional shape.

Figure 5:
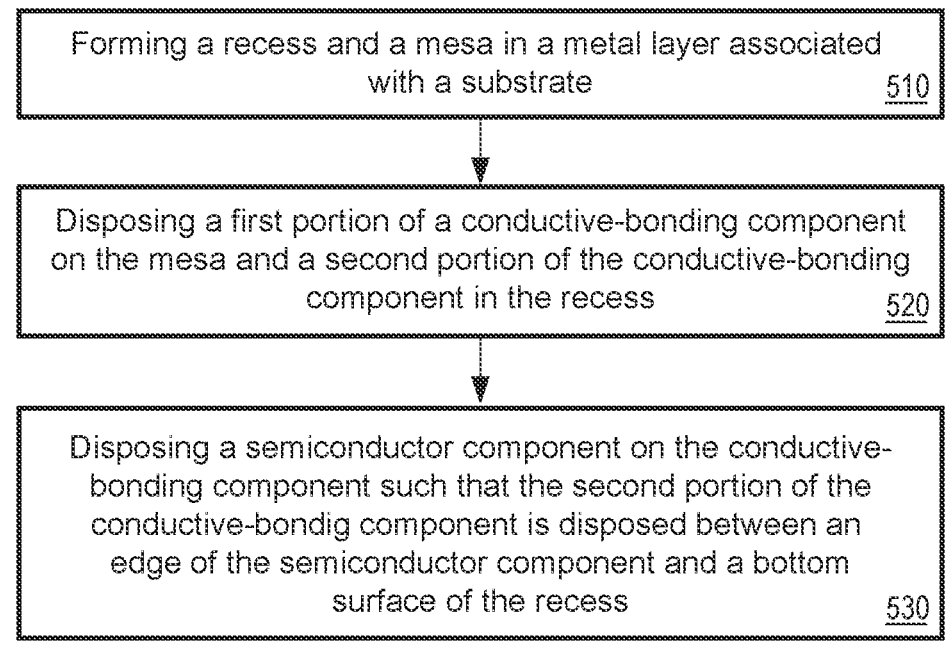
FIG. 5 is a flowchart illustrating a method of coupling a semiconductor component to a substrate including a recess via a conductive-bonding component.

FIG. 5 is a flowchart illustrating a method of coupling a semiconductor component to a substrate including a recess via a conductive-bonding component. The method can include forming a recess and a mesa in a metal layer associated with a substrate (block 510). In some implementations, the mesa can be defined by the recess around the mesa. In some implementations, the recess can be defined using an etching process. In some implementations, the recess can be defined using a machining process.

The method can include disposing a first portion of a conductive-bonding component on the mesa and a second portion of the conductive-bonding component in the recess (block 520). In some implementations, the first portion of the conductive-bonding component and the second portion of the conductive-bonding component can be connected. The conductive-bonding component can be a solder, a conductive paste, and/or so forth.

The method can include disposing a semiconductor component on the conductive-bonding component such that the second portion of the conductive-bonding component is disposed between an edge of the semiconductor component and a bottom surface of the recess (block 530). In some implementations, the edge can be vertically above the bottom of the surface of the recess. In some implementations, the edge can be vertically above approximately a midpoint of the recess. In some implementations, the thickness of the first portion of the conductive-bonding component is greater than the thickness of the second portion of the conductive-bonding component. In some implementations, the semiconductor component is a spacer or a semiconductor die.

In some implementations, the method can include reflowing the conductive-bonding component such that conductive-bonding component flows into an overflow channel associated with the recess. In some implementations, the recess is part of a channel, and the channel is defined within the substrate around a perimeter of the semiconductor component.

Figure 6:
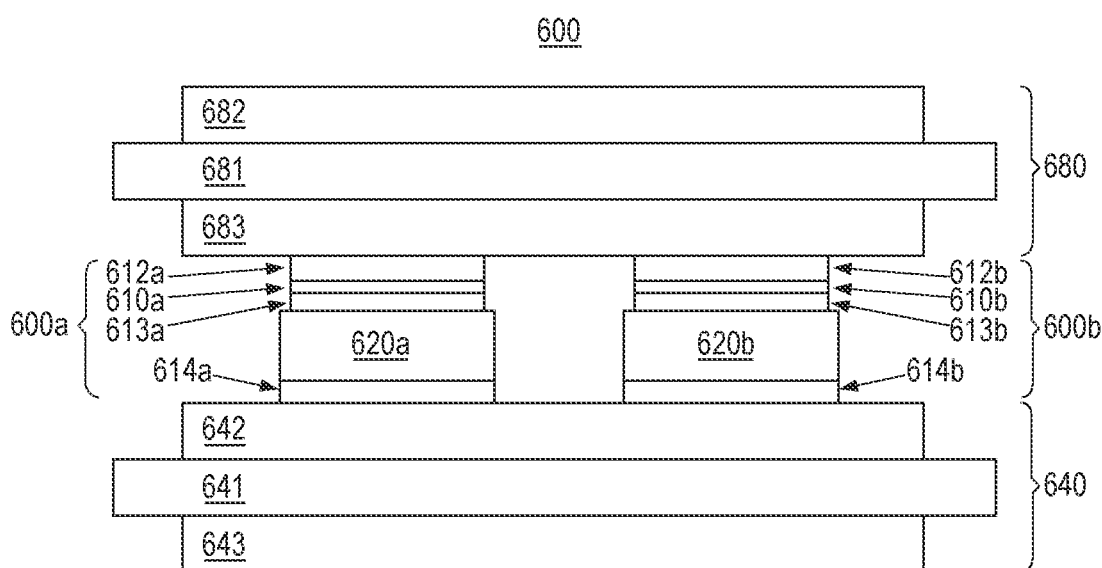
FIG. 6 illustrates a device package that can be used in connection with the innovations described herein.

FIG. 6 illustrates a device package 600 (e.g., high-power module) that can be used in connection with the innovations described herein. For example, the portion 101 of the power module shown in FIG. 1A can be included in a module such as that shown in FIG. 6.

FIG. 6 shows an example device package 600 that includes two semiconductor die (e.g., power device 610a, power device 610b) disposed between a pair of opposing substrates (e.g., substrate 640 and substrate 680). Power device 610a may, for example, be included in a vertical device stack 600a that includes a conductive spacer 620a, while power device 610b may, for example, be included in a vertical device stack 600b that includes a conductive spacer 620b. In vertical device stack 600a, power device 610a may be coupled on one side to substrate 680 and on another side to conductive spacer 620a. Conductive spacer 620a may be coupled on one side to substrate 640 and on another side to power device 610a. Similarly, in vertical device stack 600b, power device 610b may be coupled on one side to substrate 680 and on another side to conductive spacer 620b. Conductive spacer 620b may be coupled on one side to substrate 640 and on another side to power device 610b. The substrates 640 and 680 include metal layers 642, 643 and 682, 683 respectively.

The inter-component conductive-bonding components in vertical device stack 600a and/or in vertical device stack 600b may be solder, sinter, and/or fusion bonds. The inter-component conductive-bonding components in vertical device stack 600a include conductive-bonding component 612a between substrate 680 and power device 610a, conductive-bonding component 613a between power device 610a and conductive spacer 620a, and conductive-bonding component 614a between conductive spacer 620a and substrate 640. The inter-component conductive-bonding components in vertical device stack 600b include conductive-bonding component 612b between substrate 680 and power device 610b, conductive-bonding component 613b between power device 610b and conductive spacer 620b, and conductive-bonding component 614b between conductive spacer 620b and substrate 640.

One or more recesses (e.g., channels), such as those described herein, can be included in the top metal layer 642. For example, the spacer 620a and/or the spacer 620b can be coupled via the conductive-bonding component 614a and/or the conductive-bonding component 614b via one or more recesses (e.g., channels) in the top metal layer 642.

In example implementations, voids or open spaces in device package 600 between substrate 640, substrate 680, vertical device stack 600a, and vertical device stack 600b may be filled with a molding material (not shown) (e.g., a polymer or epoxy) to encapsulate vertical device stack 600a and vertical device stack 600b in device package 600.

FIG. 6 shows an example implementation of device package 600 in which vertical device stacks 600a and 600b are arranged so that both of the enclosed power devices 610a and 610b are coupled to the same substrate 680 and both conductive spacer 620a and conductive spacer 620b are coupled to the same opposing substrate (i.e., substrate 640).

In the example implementation, power device 610a and power device 610b may be semiconductor die that are coupled to substrate 640 in a standard (e.g., not a flip chip configuration). In some implementations, one or more of the power devices 610a, 610b can be a flip-chip configuration (e.g., source down orientation). In such implementations, recesses may be included in the metal layer 642 and/or the metal layer 683. In some implementations, one of more of the power devices 610b, 610b can be, for example, insulated-gate bipolar transistors (IGBTs).

In some example implementations, one of the two vertical device stacks (e.g., vertical device stack 600b) may be inverted. In other words, vertical device stacks 600a and 600b with two enclosed power devices and two enclosed conductive spacers may be arranged so that power device 610a of vertical device stack 600a is coupled to substrate 680 while power device 610b of vertical device stack 600b is coupled to the opposing substrate 640, and conductive spacer 620a of vertical device stack 600a is coupled to substrate 640 while conductive spacer 620b of vertical device stack 600b is coupled to the opposing substrate 680.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
    a semiconductor component;
    a substrate including a channel having an outer edge disposed outside of an outer perimeter of the semiconductor component; and
    a conductive-bonding component,
    the conductive-bonding component disposed between the semiconductor component and the substrate, the conductive-bonding component having a first thickness between a bottom of the channel and a bottom surface of the semiconductor component greater than a second thickness between a top of the substrate and the bottom surface of the semiconductor component, and
    the channel being in fluid communication with an overflow channel that extends from the channel and is a same width as the channel.

2. The apparatus of claim 1, wherein the channel has an inner edge, the inner edge of the channel is disposed below the semiconductor component and the outer edge is not disposed below the semiconductor component.

3. The apparatus of claim 1, wherein the channel has an inner edge, the inner edge of the channel recess is disposed below the semiconductor component, the inner edge of the channel has a sloped surface.

4. The apparatus of claim 1, wherein the channel is a first channel portion having an inner edge, the inner edge of the first channel recess portion is disposed below the semiconductor component,
- the substrate includes a second channel portion having an inner edge and an outer edge, the inner edge of the second channel portion is disposed below the semiconductor component, and
- the semiconductor component has a width greater than a width between the inner edge of the first channel portion and the inner edge of the second channel portion.

5. The apparatus of claim 1, wherein the semiconductor component has a width that is greater than a width of a mesa defined by the channel around the semiconductor component.

6. The apparatus of claim 1, wherein the overflow channel is included in a pair of orthogonally-oriented overflow channels.

7. The apparatus of claim 1, wherein the channel has a substantially flat bottom surface aligned with a plane aligned along the bottom surface of the semiconductor component.

8. The apparatus of claim 1, wherein the channel is defined within the substrate around the outer perimeter of the semiconductor component.

9. The apparatus of claim 1, wherein the semiconductor component includes at least one of a semiconductor die.

10. The apparatus of claim 1, wherein the substrate is a direct bonded metal substrate including a dielectric disposed between a first metal layer and a second metal layer, the channel is defined within the first metal layer.

11. The apparatus of claim 1, wherein the semiconductor component is an aluminum spacer.

12. An apparatus, comprising:
- an aluminum spacer;
- a substrate including a channel; and
- a conductive-bonding component,
    - the aluminum spacer being coupled to the substrate via the conductive-bonding component, the channel having an inner edge and an outer edge, the inner edge defining a mesa disposed below the aluminum spacer, the outer edge of the channel is disposed outside of an outer perimeter of the aluminum spacer.

13. The apparatus of claim 12, wherein the inner edge of the channel is disposed inside of the outer perimeter of the aluminum spacer.

14. The apparatus of claim 12, wherein the conductive-bonding component has a first thickness inside of the channel greater than a second thickness on top of the mesa.

15. The apparatus of claim 12, wherein the channel is a perimeter channel, the substrate defines an overflow channel in fluid communication with and extending from a portion of the perimeter channel, the overflow channel has a width that is the same as a width of the perimeter channel.

16. The apparatus of claim 12, wherein the channel has at least one of a ladder-shaped recess, a u-shaped recess, a semicircular-shaped recess, or a v-shaped recess.

17. An apparatus, comprising:
- a semiconductor component;
- a substrate including a channel having an inner edge and an outer edge, the outer edge being disposed outside of an outer perimeter of the semiconductor component, the inner edge of the channel defining a mesa disposed below the semiconductor component, the channel is in fluid communication with a first overflow channel and a second overflow channel aligned orthogonal to the first overflow channel;
- a conductive-bonding component; and
- the conductive-bonding component disposed between the semiconductor component and the substrate.

18. The apparatus of claim 17, wherein the inner edge of the channel is disposed below the semiconductor component and the outer edge is not disposed below the semiconductor component.

19. The apparatus of claim 17, wherein the inner edge of the channel is disposed below the semiconductor component, the inner edge of the channel has a sloped surface.

\* \* \* \* \*